United States Patent [19]

Moon

[11] Patent Number: 5,702,960
[45] Date of Patent: Dec. 30, 1997

[54] METHOD FOR MANUFACTURING POLYSILICON THIN FILM TRANSISTOR

[75] Inventor: Kyusun Moon, Suwon, Rep. of Korea

[73] Assignee: Samsung Electronics Co., Ltd., Suwon, Rep. of Korea

[21] Appl. No.: 396,162

[22] Filed: Feb. 27, 1995

[30] Foreign Application Priority Data

Feb. 25, 1994 [KR] Rep. of Korea ............... 94-3531

[51] Int. Cl.$^6$ ............................................. H01L 21/786
[52] U.S. Cl. .................... 437/40 TFT; 437/41 TFT; 437/229
[58] Field of Search .............. 437/40 TFI, 41 TFI, 437/40 TFT, 41 TFT, 229, 40 RLD, 21, 913, 944; 148/DIG. 100, DIG. 150; 430/313

[56] References Cited

U.S. PATENT DOCUMENTS

| | | | |
|---|---|---|---|
| 5,130,263 | 7/1992 | Possin et al. | 437/229 |
| 5,198,377 | 3/1993 | Kato et al. | 437/229 |
| 5,198,379 | 3/1993 | Adan | 437/21 |
| 5,246,468 | 9/1993 | Takahashi et al. | 437/229 |
| 5,348,897 | 9/1994 | Yen | 437/40 TFI |
| 5,371,025 | 12/1994 | Sung | 437/41 TFI |
| 5,385,854 | 1/1995 | Batra et al. | 437/41 TFI |
| 5,420,048 | 5/1995 | Kondo | 437/41 TFI |

FOREIGN PATENT DOCUMENTS

| | | | |
|---|---|---|---|
| 61-105870 | 5/1986 | Japan | 437/41 TFT |
| 5082549 | 4/1993 | Japan . | |

*Primary Examiner*—Michael Trinh
*Attorney, Agent, or Firm*—Cushman Darby & Cushman, IP Group of Pillsbury Madison & Sutro LLP

[57] ABSTRACT

A method for manufacturing a polysilicon thin film transistor in which a lower gate pattern is formed by stacking a conductive material on a transparent substrate, then a buffering insulating layer, a polysilicon layer, a gate insulating layer and a conductor layer are formed by sequentially stacking an insulating material, a polysilicon, an insulating material and a conductive material. Then a photoresist pattern is formed by coating a photoresist and exposing the backside of the photoresist using the lower gate pattern, and thereafter, an upper gate pattern is formed by etching the conductor layer using the photoresist pattern as a mask. The method of the present invention is suitable for manufacturing the polysilicon thin film transistor of an offset structure or of an LDD structure.

4 Claims, 5 Drawing Sheets

METHOD FOR MANUFACTURING POLYSILICON THIN FILM TRANSISTOR

BACKGROUND OF THE INVENTION

(1) Field of the Invention

The present invention relates to a method for manufacturing a polysilicon thin film transistor. More particularly, it relates to a method for manufacturing a polysilicon thin film transistor by utilizing a lower gate pattern formed on a transparent insulating substrate, the lower gate pattern having the same construction as a gate pattern which is formed on an upper part of the polysilicon thin film transistor at the time of manufacturing the polysilicon thin film transistor of a type having a gate on the upper part.

(2) Description of Related Art

While the polysilicon thin film transistor has advantages in that can be easily manufactured and manufacturing coat is small, its off-current is rather large compared to an amorphous silicon thin film transistor, and accordingly, in many cases, a lightly-doped drain (LDD) structure of off-set structure is adopted to reduce the off-current.

FIG. 1 shows a thin film transistor constructed in accordance with conventional art. It includes transparent substrate 1, a polysilicon layer including active layer 4, source region 4a, and drain region 4b, gate insulation film 5 and conductor layer 6.

FIGS. 2A to 2E are sectional views respectively showing the steps in the manufacture of a thin film transistor utilizing photolithography in accordance with a conventional art.

First, as shown in FIG. 2A, an insulating layer 25 and a conductor layer 26 are formed by stacking an insulating material and a conductive material on a polysilicon layer 24 which was previously formed an a transparent substrate (not shown).

Next, as shown in FIG. 2B, a photoresist pattern 28 is formed by coating the photoresist on the conductor layer 26 and developing and printing the photoresist in a certain pattern.

As shown in FIG. 2C, a gate pattern 29 is formed by etching the conductor layer 26 utilizing the photoresist pattern 28 as a mask and then removing the photoresist pattern 28.

The photoresist is again doped and then removed leaving a part to cover the gate pattern 29. Ions of high concentration are implanted utilizing the remaining photoresist 31 as a mask, then, as shown in FIG. 2D, high concentration regions 41 and 42 are formed and an offset structure is completed.

Finally, as shown in FIG. 2E, low concentration regions 43 and 44 are formed by removing the remaining photoresist 31 and implanting ions of low concentration, the an LDD structure is completed.

In these processes, the photoresist pattern 31 is formed utilizing an ultra violet (UV) exposing apparatus and, at the time of forming the photoresist pattern 31, the gate pattern 29 must be precisely placed at the center of the photoresist pattern 31. Otherwise, characteristics of the device are degraded. However, since it is not easy to precisely place the gate pattern 29 at the center of the photoresist pattern 31, poor quality products may be produced.

For a relevant document to solve such a problem, there is Japanese Patent Opening Publication No. 93-218074. The publication is explained below in detail with reference to FIGS. 3A to 3D.

In the invention described in the publication, a first gate pattern 29' and a nitride film pattern 28' are formed by sequentially stacking an insulating layer 25, conductor layer 26 and a nitride silicon film 27' on a polysilicon layer 24 (FIG. 3A), and thereafter, patterning the nitride silicon film 27' and the conductor layer 26 by utilizing an anisotropic etching.

Next, high concentration regions 41 and 42 are formed by implanting ions of high concentration utilizing the nitride film pattern 28' as a mask (FIG. 3B), then an offset structure is completed.

Finally, a gate patter 29 is formed by etching the sides of the first gate pattern 29' to a certain degree (FIG. 3C), and low concentration regions 43 and 44 are formed by implanting ions of low concentrations after removing the nitride film pattern 28', then an LDD structure is completed.

It is known that the thin film transistor of the offset and LDD structure manufactured as described above relaxes an electrical field of a channel region near a drain region thereby reducing the off current at the time of applying a reverse bias to the gate (S, Kaneko, IEEE Trans, on Electron Devices, Vol. 36, No. 12, December 1989).

Such a conventional method may solve the above-mentioned problems by using the ultra violet exposing apparatus, however, this method causes another problem. This method comprises a process of stacking and patterning the nitride film, a process of etching the sides of the first gate pattern, and a process of removing again the nitride film, so that the entire process becomes complicated. Moreover, it is extremely difficult to etch the sides of the first gate pattern to a proper thickness.

SUMMARY OF THE INVENTION

Therefore, the purpose of the present invention is to solve the problem of aligning the high concentration region and low concentration regions occurring at the time of forming the polysilicon thin film transistor of the LDD structure and the offset structure by a simple process.

The present invention to achieve the above purpose comprises a process of forming the lower gate pattern by stacking the conductive material on the transparent insulation substrate, a process of forming the first insulating layer, the semiconductor layer by sequentially stacking the insulating material, semiconductor, the insulating material and the conductive material, and a process of forming the uppergate pattern by etching the conductor layer by exposing the backside of the substrate utilizing the lower gate pattern as a mask.

The semiconductor stacked on the semiconductor layer is polysilicon, and the conductive material stacked on the lower gate insulating layer is preferably selected from among Cr, Mo and W which are high melting point metals having resistance against high temperature.

The process of forming the upper gate pattern may comprise a process of forming the photoresist pattern by coating the positive photoresist on the conductor layer and exposing the backside of the photoresist and thereafter developing and printing the photoresist, and a process of forming the upper gate pattern by etching the conductive layer utilizing the photoresist pattern as a mask.

In another method for forming the upper gate pattern, the negative photoresist is coated on the second insulating layer and the pattern is formed by exposing the backside of the photoresist before forming the conductor layer by stacking the conductive material, and thereafter the conductive material is stacked and the patterned negative photoresist is removed.

The upper gate pattern must be apart from the high concentration region to some extent to make the offset of LDD structure, and this can be accomplished by making the width of the upper gate pattern smaller than the lower gate pattern. To make the upper gate pattern smaller than the lover gate pattern, the exposure time, development time and etching time are adjusted in the lithography process which makes the gate pattern.

To form the offset structure of the present invention, a process for forming the photoresist pattern by removing the first photoresist pattern, coating again the photoresist, exposing the backside of the photoresist utilizing the lower gate pattern as a mask, and thereafter, developing and printing, a process for implanting ions utilizing the second photoresist pattern as a process for removing the second photoresist pattern are performed. In this process, the second photoresist pattern must be made to completely cover the upper gate pattern.

To form the LDD structure, a process of implanting ions of lower concentration than that of ions used for forming the offset structure utilizing the upper gate pattern as a mask is further performed.

DETAILED DESCRIPTION OF A PREFERRED EMBODIMENT

Figure 4:
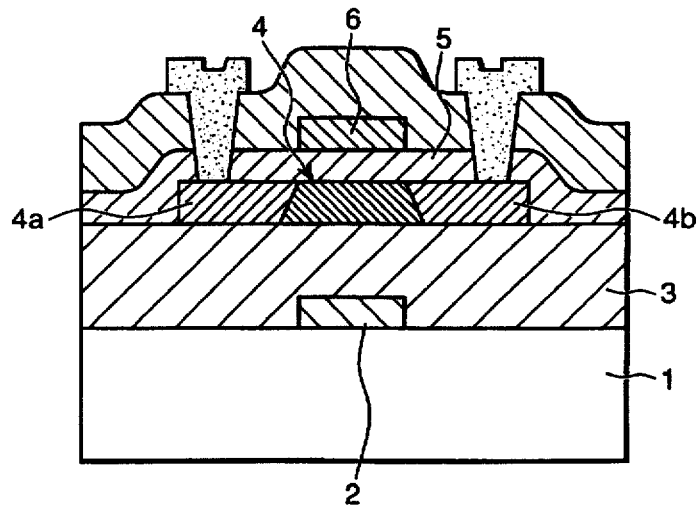
FIG. 4 shows a sectional view of a thin film transistor of the present invention.

FIG. 4 shows a thin film transistor constructed in accordance with the method of the present invention. It includes transparent substrate 1, lower gate pattern 2, insulating layer 3, a polysilicon layer including active layer 4, source region 4a, and drain region 4b, gate insulation 5 and conductor layer 6.

Figure 5A:
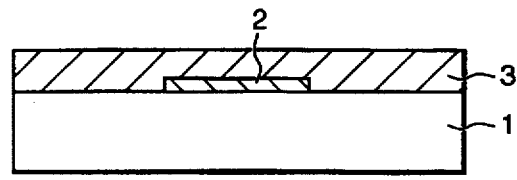
FIGS. 5A to 5E are sectional views which respectively show the steps in the manufacture of a thin film transistor in accordance with the present invention.

The method of the present invention is described in more detail with reference to the attached drawings. As shown in FIG. 5A, a lower gate pattern a is formed on a transparent substrate 1, and an insulating layer 3 is stacked covering the lower gate pattern 2. The material used for the lower gate pattern 2 is the transparent material having the resistance to the high temperature and is preferably Cr, Mo or W which is high melting point metal. To form the lower gate pattern 2 is the gist of the present invention. This simplifies the entire process and solves the problems of aligning the high concentration region and low concentration region.

Figure 5B:
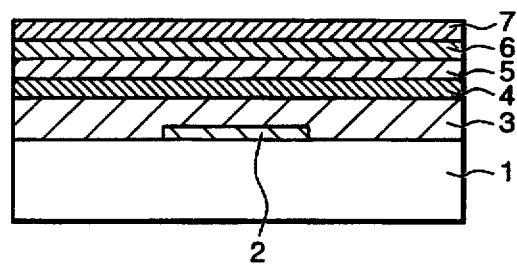

Next, a polysilicon layer 4 is formed to form a source, drain and semiconductor active layer. As shown in FIG. 5B, a gate insulation film 5 and a conductor layer 6 are formed by stacking an insulating material and conductive material which passes the ultra violet on the polysilicon layer 4, and a positive photoresist 7 is coated. Here, polysilicon doped with ions is mainly used as the conductive material.

Figure 5C:
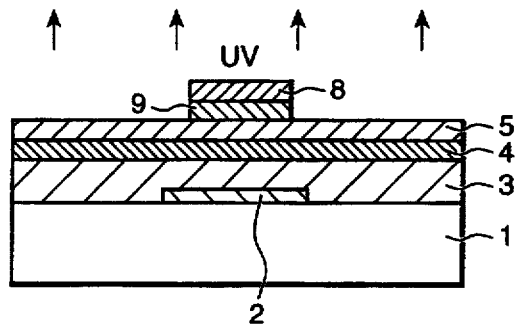

Next, if the ultra violet radiates to the backside in contrast to the prior art, the lower gate pattern 2 serves as a photomask so that only the portion of the photoresist which is not interrupted by the lower gate pattern 2 receives the ultra violet. If the photoresist is developed and printed, only the photoresist 8 which is on the lower gate pattern 2 remains and all other portions of the photoresist are removed. As shown in FIG. 5C, an upper gate pattern 9 having identical planar structure to the lower gate pattern 2 is formed by dry etching the conductive layer 6 utilizing the remaining photoresist 8 as a mask.

At this time, the width of the upper gate pattern 9 is preferably smaller than that of the lower gate pattern 2 to form the offset of LDD structure of the present invention, and the difference between the two widths can be adjusted by changing the radiation time of the ultra violet, the developing time, or the etching time of the photoresist at the time of photolithography process. If the difference between the two widths is increased, the off current is decreased.

Figure 6A:
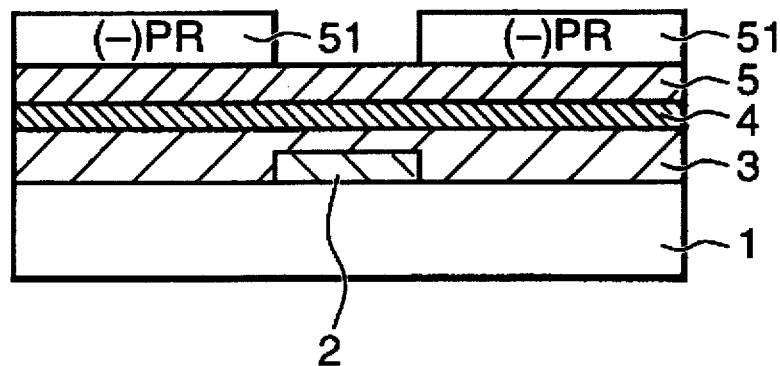
FIGS. 6A and 6B illustrate forming an upper gate pattern using a lift-off method in the manufacture of a thin film transistor in accordance with the present invention.
Figure 6B:
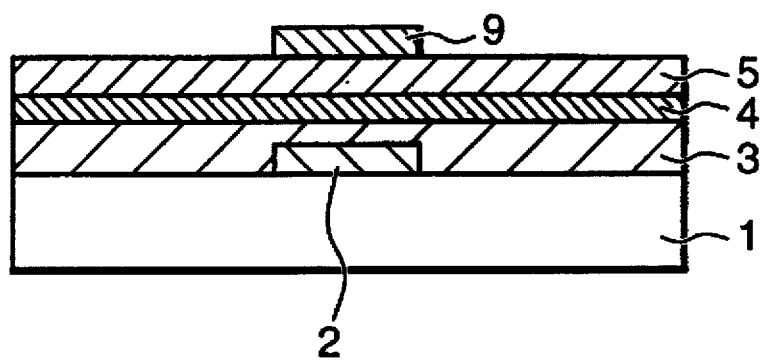

The upper gate pattern 9 can be further easily formed if a lift-off method is used. That is, as shown in FIGS. 6A and 6B, the negative photoresist is coated prior to formation of the conductor layer 6. Exposing the backside of the substrate, the lower gate pattern 2 serves as the photomask so that the photoresist on the photomask does not receive the light. Since the photoresist is negative, only the portion which does not receive the light is removed through the development and printing.

If the conductive material is stacked on the patterned photoresist 51 and the remaining photoresist is removed, the conductor layer placed on the photoresist is removed at the same time so that the upper gate pattern can be simply formed.

Such a lift-off method has an advantage in that it can decrease a poor quality such as a fine discontinuity which may occur at a stepped portion, compared to a method of etching after the film formation according to the conventional art. Especially, when forming a film on a material having a vertical step, the film can be formed thinly on the side of the edge or there may exist a phenomenon of film floating. The etchant can penetrate into such places so as to produce a fine discontinuity. However, by utilizing the lift-off method, the etchant is not used but only a solvent which melts the photoresist is used so that such a problem does not occur.

Figure 5D:
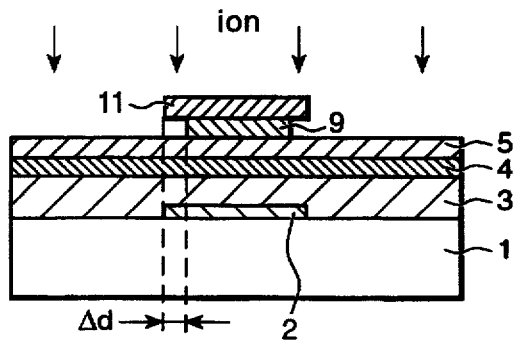
Figure 5E:
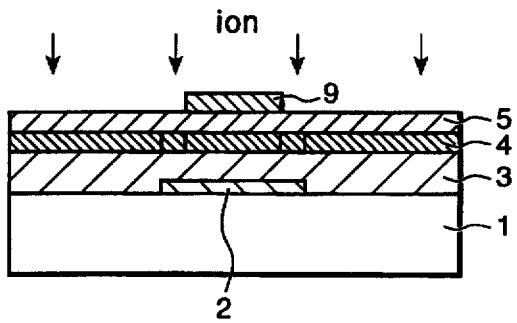

Next, after coating with a second photoresist, a photoresist pattern 11 is formed, as shown in FIG. 5D, by radiating the ultra-violet to the backside of the photoresist utilizing the lower gate pattern 2.

Ions of high concentration are implanted utilizing the photoresist pattern 11 as a mask, and the photoresist pattern 11 is removed, then the thin film transistor of the offset structure is completed.

In addition, if a process of implanting ions of lower concentration is further performed on the offset structure, the thin film transistor of the LDD structure can be manufactured.

Figure 1:
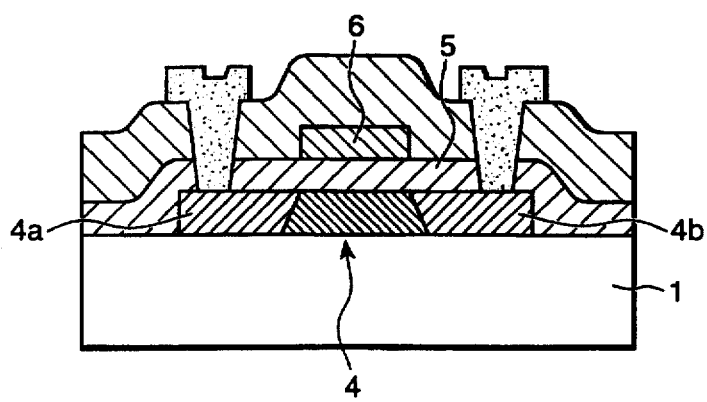
FIG. 1 shows a sectional view of a thin film transistor in accordance with a conventional art.
Figure 2A:
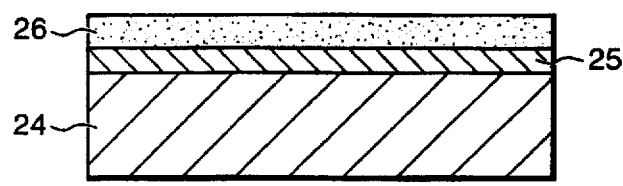
FIGS. 2A to 2E are sectional views which respectively show the steps in the manufacture of a thin film transistor by utilizing photolithography in accordance with a conventional art.
Figure 2B:
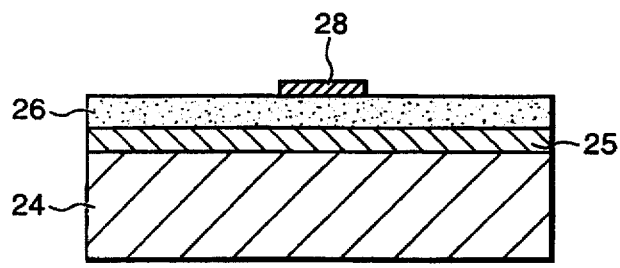
Figure 2C:
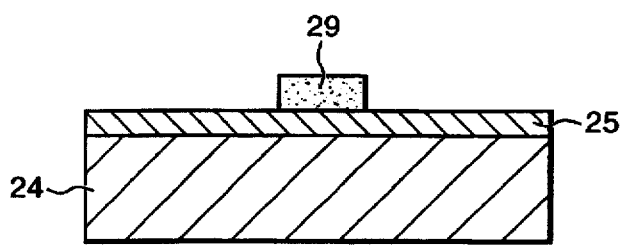
Figure 2D:
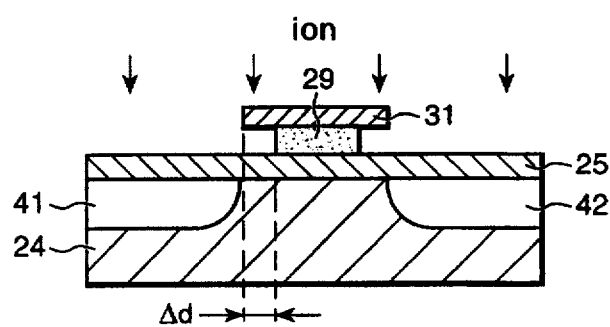
Figure 2E:
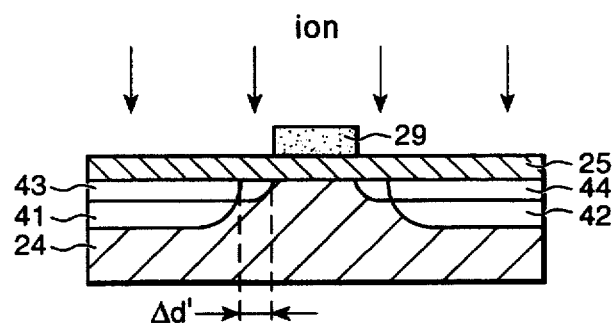
Figure 3A:
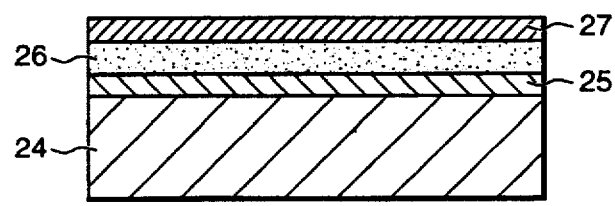
FIGS. 3A to 3D are sectional views which respectively show the steps in the manufacture of a thin film transistor by utilizing photolithography in accordance with a conventional art.
Figure 3B:
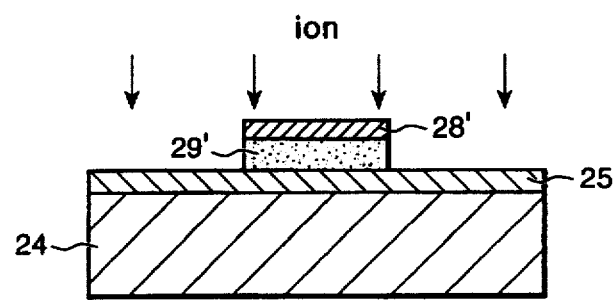
Figure 3C:
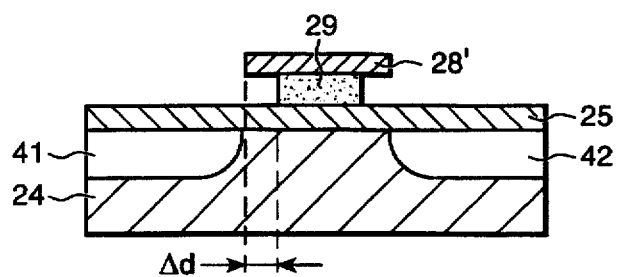
Figure 3D:
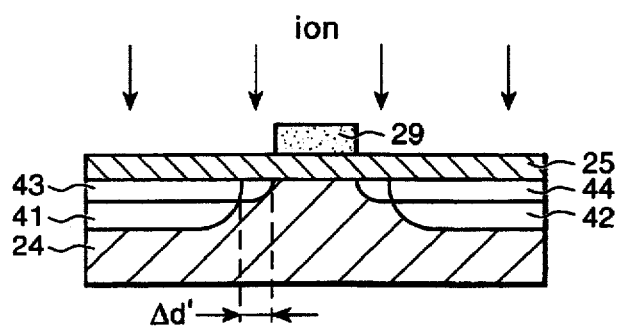

FIGS. 1 and 4 illustrate the structure of a thin film transistor manufactured according to the conventional method and according to the present invention, respectively.

In the offset and LDD structure of the present invention, since the upper gate pattern is formed by backside exposure utilizing the previously-formed lower gate pattern 2, the mask process for aligning the high concentration region and the low concentration region with the upper gate pattern can be omitted. Therefore, the offset and LDD structure can be simply embodied, structures which can avoid the increase in the leakage current according to the high electrical field occurring between the gate and drain at the time of reverse bias, without utilizing the complicated process.

Furthermore, since the upper gate pattern can be manufactured by the lift-off method, the gate pattern can be formed, and the gate discontinuity can be reduced which occurs due to the penetration of the etchant into the stepped portion at the time of forming the metal pattern by etching.

What is claimed is:

1. A method for manufacturing a thin film transistor comprising the steps of:

preparing a transparent substrate having a top face and a bottom face;

forming a lower gate pattern on said top face of said transparent substrate;

depositing a first insulating layer, a semiconductor layer, a second insulating layer, and a conducting layer successively over said lower gate pattern;

forming a first photoresist layer on said conducting layer;

patterning said first photoresist layer by exposing through said bottom face of said transparent substrate using said lower gate pattern as a mask;

forming an upper gate pattern by etching said conducting layer using said patterned first photoresist layer as a mask, said upper gate pattern being formed so as to have a width smaller than a width of said lower gate pattern;

removing said patterned first photoresist layer;

forming a second photoresist layer on said upper gate pattern;

patterning said second photoresist layer by exposing through said bottom face of said transparent substrate using said lower gate pattern as a mask, said second photoresist layer being patterned so that said patterned second photoresist layer has a width larger than said width of said upper gate pattern;

implanting ions into said semiconductor layer utilizing said patterned second photoresist layer as a mask; and removing said patterned second photoresist layer.

2. The method according to claim 1, further comprising a step of implanting ions into said implanted semiconductor layer utilizing said upper gate pattern as a mask after removing said patterned second photoresist layer.

3. A method for manufacturing a thin film transistor comprising the steps of:

preparing a transparent substrate having a top face and a bottom face;

forming a lower gate pattern on said top face of said transparent substrate;

forming a first insulating layer, a semiconductor layer, a second insulating layer and a negative photoresist layer successively over said lower gate pattern;

patterning said negative photoresist layer by exposing through said bottom face of said transparent substrate using said lower gate pattern as a mask;

forming a conductor layer on said patterned negative photoresist layer and exposed portions of said second insulating layer;

forming an upper gate pattern by removing said patterned negative photoresist layer and by removing portions of said conductor layer formed on said patterned negative photoresist layer, said upper gate pattern being formed so as to have a width smaller than a width of said lower gate pattern;

forming a second photoresist layer on said upper gate pattern;

patterning said second photoresist layer by exposing through said bottom face of said transparent substrate using said lower gate pattern as a mask, said second photoresist layer being patterned so that said patterned second photoresist layer has a width larger than said width of said upper gate pattern;

implanting ions into said semiconductor layer utilizing said patterned second photoresist layer as a mask; and removing said patterned second photoresist layer.

4. The method according to claim 3, further comprising a step of implanting ions into said implanted semiconductor layer utilizing said upper gate pattern as a mask after removing said patterned second photoresist layer.

* * * * *